United States Patent
Huff et al.

(10) Patent No.: US 11,788,929 B1
(45) Date of Patent: Oct. 17, 2023

(54) TECHNIQUES FOR WAFER LEVEL DIE TESTING USING SACRIFICIAL STRUCTURES

(71) Applicant: AEVA, INC., Mountain View, CA (US)

(72) Inventors: Brett E. Huff, Keller, TX (US); Pradeep Srinivasan, Fremont, CA (US)

(73) Assignee: Aeva, Inc., Mountain View, CA (US)

( * ) Notice: Subject to any disclaimer, the term of this patent is extended or adjusted under 35 U.S.C. 154(b) by 0 days.

(21) Appl. No.: 17/956,331

(22) Filed: Sep. 29, 2022

(51) Int. Cl.
*G01M 11/00* (2006.01)
*G01R 31/317* (2006.01)
*G01R 31/3185* (2006.01)
*G02B 6/12* (2006.01)

(52) U.S. Cl.
CPC ............ *G01M 11/33* (2013.01); *G01M 11/30* (2013.01); *G01R 31/31728* (2013.01); *G01R 31/318511* (2013.01); *G02B 6/12004* (2013.01)

(58) Field of Classification Search
CPC ...... G01M 11/00; G01M 11/30; G01M 11/33; G01M 11/331; G01M 11/332; G01M 11/333; G01M 11/334; G01M 11/335; G01M 11/336; G01M 11/337; G01M 11/338; G01R 31/31728; G01R 31/381511; G01R 31/318511; G02B 6/12004; G02B 6/12011; G02B 6/12019; G02B 6/12033; H04B 10/0731; H01L 25/167
See application file for complete search history.

(56) References Cited

U.S. PATENT DOCUMENTS

| | | | | |
|---|---|---|---|---|
| 8,724,100 B1* | 5/2014 | Asghari | ............... | G01J 1/0425 |
| | | | | 356/73 |
| 8,916,874 B2* | 12/2014 | Whitbread | ............ | G01M 11/33 |
| | | | | 257/E23.179 |
| 9,459,177 B1* | 10/2016 | Dong | ..................... | G02B 6/124 |
| 9,735,885 B1* | 8/2017 | Sayyah | ................... | G02F 1/292 |
| 9,904,016 B2* | 2/2018 | Dangel | ................ | G02B 6/125 |
| 10,132,999 B2* | 11/2018 | Barwicz | ................ | G02B 6/136 |
| 10,190,941 B2* | 1/2019 | Kamei | .................. | G01M 11/33 |
| 10,222,294 B2* | 3/2019 | Feng | ..................... | G01M 11/30 |
| 10,302,859 B1* | 5/2019 | Martin | ..................... | G02B 6/24 |
| 10,359,567 B2* | 7/2019 | Novack | ................ | G01R 31/308 |
| 10,877,229 B2* | 12/2020 | Tummidi | ................ | G02B 6/42 |
| 10,964,605 B1* | 3/2021 | Vermeulen | ........... | G02B 6/1223 |
| 10,998,974 B2* | 5/2021 | Sugiyama | .............. | H04B 10/40 |
| 11,163,120 B2* | 11/2021 | Ardalan | .................. | G02B 6/30 |
| 11,295,994 B2* | 4/2022 | Lin | .......... | G02B 6/13 |
| 11,415,752 B2* | 8/2022 | Fukuda | ............ | H01L 31/02327 |
| 11,463,173 B1* | 10/2022 | Zhang | ................... | H04B 10/40 |
| 11,614,584 B2* | 3/2023 | Venkatesan | ........ | G02B 6/12016 |
| | | | | 385/14 |
| 2004/0033633 A1* | 2/2004 | Yang | ........................ | G02B 6/13 |
| | | | | 438/14 |
| 2018/0313718 A1* | 11/2018 | Traverso | ............... | G02B 6/305 |

(Continued)

*Primary Examiner* — Gordon J Stock, Jr.
(74) *Attorney, Agent, or Firm* — Womble Bond Dickinson (US) LLP (57) ABSTRACT

A method of testing a photonics die at the wafer level includes providing a sacrificial waveguide and a grating coupler at least partially in a scribe line between dies of a wafer, performing one or more tests on the dies of the wafer via the sacrificial waveguide and grating coupler in the scribe line, and removing the sacrificial waveguide during separation of the dies of the wafer.

15 Claims, 7 Drawing Sheets

(56) References Cited

U.S. PATENT DOCUMENTS

| | | | |
|---|---|---|---|
| 2019/0372664 A1* | 12/2019 | Sugiyama | G01M 11/30 |
| 2020/0033228 A1* | 1/2020 | Piazza | G01M 11/335 |
| 2020/0033533 A1* | 1/2020 | Khanna | G02B 6/30 |
| 2020/0064404 A1* | 2/2020 | Sugiyama | G01R 31/318511 |
| 2020/0232878 A1* | 7/2020 | Ma | G01M 11/331 |
| 2021/0124107 A1* | 4/2021 | Meade | G02B 6/12 |
| 2021/0124118 A1* | 4/2021 | Sayyah | G01S 17/34 |
| 2021/0333473 A1* | 10/2021 | Venkatesan | G02B 6/1225 |
| 2022/0171059 A1* | 6/2022 | Salsbury | G01S 17/931 |

\* cited by examiner

TECHNIQUES FOR WAFER LEVEL DIE TESTING USING SACRIFICIAL STRUCTURES

FIELD

The present disclosure is related to LIDAR (light detection and ranging) systems in general, and more particularly to using sacrificial structures for wafer level photonics die testing.

BACKGROUND

Frequency-Modulated Continuous-Wave (FMCW) LIDAR systems use tunable, infrared lasers for frequency-chirped illumination of targets, and coherent receivers for detection of backscattered or reflected light from the targets that are combined with a local copy of the transmitted signal. Mixing the local copy with the return signal, delayed by the round-trip time to the target and back, generates signals at the receiver with frequencies that are proportional to the distance to each target in the field of view of the system. Multiple dies used in such LIDAR systems can be manufactured on a single silicon wafer. The dies are then separated to be incorporated into a LIDAR system.

SUMMARY

The present disclosure describes examples of a system and method for wafer level die testing using sacrificial optical structures.

In some embodiments, a method of photonics die testing includes providing a sacrificial waveguide and a grating coupler at least partially in a scribe line between dies of a wafer, performing one or more tests on the dies of the wafer via the sacrificial waveguide and grating coupler in the scribe line, and removing the sacrificial waveguide during separation of the dies of the wafer.

In some embodiments, a gap is provided between the sacrificial waveguide and a waveguide of a corresponding die. In some embodiments, the sacrificial waveguide is in the scribe line between dies. In some embodiments, the grating coupler is provided in a neutral area of a neighboring die. In some embodiments, the sacrificial waveguide is removed during separation of the dies and wherein the grating coupler remains within the neighboring die. In some embodiments, the separation of the dies comprises at least one of etching, dicing, or etching and dicing. In some embodiments, the method further includes performing the one or more tests on the dies of the wafer prior to removing the sacrificial waveguide and grating coupler. In some embodiments, the grating coupler is provided in a waste area of the wafer. In some embodiments, the dies of the wafer comprise photonics chip dies to be incorporated into a frequency modulated continuous wave (FMCW) light detection and ranging (LIDAR) system. In some embodiments, the one or more tests include a measurement of light transmitted through waveguides of the dies of the wafer and out of the grating coupler.

In one embodiment, a photonics die testing system includes a wafer including multiple dies and sacrificial waveguides and grating couplers associated with waveguides of the dies, wherein each sacrificial waveguide of the plurality of the sacrificial waveguides is disposed at least partially in a scribe line between the dies of the wafer. The photonics die testing system further includes a detector to test optical transmission of at least one die of the plurality of dies via the sacrificial waveguides and grating couplers.

In some embodiment, the sacrificial waveguides are removed during separation of the dies. In some embodiment, the separation of the dies includes at least one of etching, dicing, or etching and dicing. In some embodiment, each of the sacrificial waveguides is disposed in the scribe line between dies of the wafer and wherein each grating coupler of the grating couplers is provided in a neutral area of a neighboring die. In some embodiment, each of the sacrificial waveguides are removed during separation and at least one of the grating couplers remains within the neighboring die. In some embodiment, a gap is provided between each sacrificial waveguide and a waveguide of a corresponding die.

In some embodiment, the detector tests the dies of the wafer prior to removing the plurality of sacrificial waveguides during separation of the plurality of dies. In some embodiments, at least one of the grating couplers is provided in a waste area of the wafer. In some embodiments, the dies of the wafer are photonics chip dies. In some embodiments, the photonics die testing system further includes an optical source to transmit an optical beam through waveguides of the plurality of photonics chip dies, through the sacrificial waveguides, and out the grating couplers for testing of the plurality of photonics chip dies via the detector.

BRIEF DESCRIPTION OF THE DRAWINGS

For a more complete understanding of various examples, reference is now made to the following detailed description taken in connection with the accompanying drawings in which like identifiers correspond to like elements.

DETAILED DESCRIPTION

The present disclosure describes various examples of testing of dies (e.g., for a LIDAR system) at the wafer level. According to some embodiments, the described LIDAR system described herein may be implemented in any sensing market, such as, but not limited to, transportation, manufacturing, metrology, medical, virtual reality, augmented reality, and security systems. According to some embodiments, the described LIDAR system is implemented as part of a front-end of frequency modulated continuous-wave (FMCW) device that assists with spatial awareness for automated driver assist systems, or self-driving vehicles.

Photonics chips that are incorporated into a LIDAR system may be manufactured from a silicon wafer. For example, several photonics chips, also referred to as "dies," may be produced from a single silicon wafer. The construction of these dies may be performed by die production techniques which include, but may not be limited to, etching, printing, lithography, and the like, etc. Once the dies have been constructed, but before the dies of the wafer are separated, one or more tests may be performed on the dies to determine whether the dies are functioning as intended based on a predetermined circuit design (e.g., a design in which the light throughput of waveguides meets a desirable threshold). Conventionally, a probe with a prism may be inserted into a gap between the dies to measure edge coupled light. However, this approach requires relatively large gaps between the dies which wastes silicon and also risks contact between the probe and the dies which can cause potentially damage to both.

Other conventional approaches include a mirrored surface in the gap between the dies. This approach requires significant additional engineering and fabrication which increases manufacturing costs. Some conventional approaches include an additional output line leading to a grating coupler which splits off a portion of the output to be measured. However, the splitting off of a portion of the output beam reduces output beam power and thus reduces range of the output beam and the LIDAR detection capabilities.

Embodiments of the present disclosure address the issues described above, and other deficiencies caused by conventional die testing methods by, among other things, providing sacrificial waveguides in a scribe line and sacrificial grating couplers coupled to the sacrificial waveguides for input and output of an optical beam for testing functionality of the dies of a wafer. As will be described herein, during a test of a die, an optical beam may be transmitted through the waveguides of the die (e.g., via a grating coupling, via an integrated optical source, or any other methods). In this fashion, the optical beam may propagate through the waveguides of the die to a sacrificial waveguide and out of the sacrificial grating coupler (also referred to herein as a "grating coupler") associated with the sacrificial waveguide. The optical beam output from the grating coupler is then measured to determine if the output is within an expected range or above an expected threshold based on the design of the die and the input optical beam. After testing the dies, the dies can be separated which also separates or removes the sacrificial waveguide and grating coupler from the corresponding die. Additional details regarding the sacrificial waveguides, the sacrificial grating couplers, testing, and separation of the dies of a wafer are described below with respect to FIGS. 3-7.

Although described throughout the present disclosure with respect to dies of a LIDAR system, the techniques described herein may be used in conjunction with the manufacture and testing of any type of die or system that includes edge coupling of an optical beam.

Figure 1:
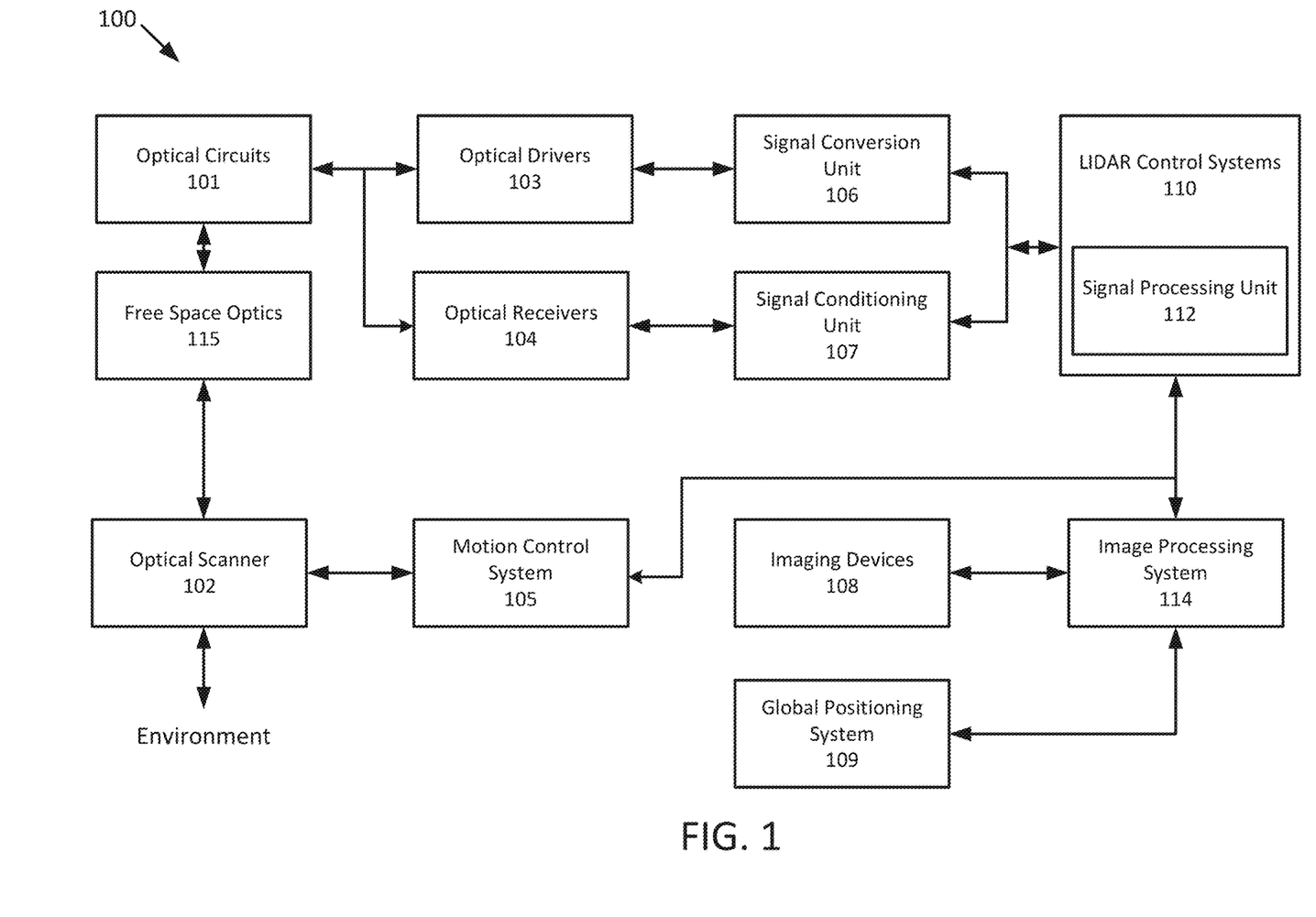
FIG. 1 is a block diagram illustrating an example LIDAR system that utilize dies produced from embodiments of the present disclosure.

FIG. 1 illustrates a LIDAR system 100 that utilizes dies produced from embodiments of the present disclosure. The LIDAR system 100 includes one or more of each of a number of components but may include fewer or additional components than shown in FIG. 1. One or more of the components depicted in FIG. 1 can be implemented on a photonics chip, according to some embodiments. The optical circuits 101 may include a combination of active optical components and passive optical components. Active optical components may generate, amplify, and/or detect optical signals and the like. In some examples, the active optical component includes optical beams at different wavelengths, and includes one or more optical amplifiers, one or more optical detectors, or the like.

Free space optics 115 may include one or more optical waveguides to carry optical signals, and route and manipulate optical signals to appropriate input/output ports of the active optical circuit. The free space optics 115 may also include one or more optical components such as taps, wavelength division multiplexers (WDM), splitters/combiners, polarization beam splitters (PBS), collimators, couplers or the like. In some examples, the free space optics 115 may include components to transform the polarization state and direct received polarized light to optical detectors using a PBS, for example. The free space optics 115 may further include a diffractive element to deflect optical beams having different frequencies at different angles along an axis (e.g., a fast-axis).

In some examples, the LIDAR system 100 includes an optical scanner 102 that includes one or more scanning mirrors that are rotatable along an axis (e.g., a slow-axis) that is orthogonal or substantially orthogonal to the fast-axis of the diffractive element to steer optical signals to scan an environment according to a scanning pattern. For instance, the scanning mirrors may be rotatable by one or more galvanometers. Objects in the target environment may scatter an incident light into a return optical beam or a target return signal. The optical scanner 102 also collects the return optical beam or the target return signal, which may be returned to the passive optical circuit component of the optical circuits 101. For example, the return optical beam may be directed to an optical detector by a polarization beam splitter. In addition to the mirrors and galvanometers, the optical scanner 102 may include components such as a quarter-wave plate, lens, anti-reflective coated window or the like.

To control and support the optical circuits 101 and optical scanner 102, the LIDAR system 100 includes LIDAR control systems 110. The LIDAR control systems 110 may include a processing device for the LIDAR system 100. In some examples, the processing device may be one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. The processing device may also be one or more special-purpose processing devices such as an application specific integrated circuit (ASIC), a field programmable gate array (FPGA), a digital signal processor (DSP), network processor, or the like.

In some examples, the LIDAR control systems 110 may include a signal processing unit 112 such as a DSP. The LIDAR control systems 110 are configured to output digital control signals to control optical drivers 103. In some examples, the digital control signals may be converted to analog signals through signal conversion unit 106. For example, the signal conversion unit 106 may include a digital-to-analog converter. The optical drivers 103 may then provide drive signals to active optical components of optical circuits 101 to drive optical sources such as lasers and amplifiers. In some examples, several optical drivers 103 and signal conversion units 106 may be provided to drive multiple optical sources.

The LIDAR control systems 110 are also configured to output digital control signals for the optical scanner 102. A motion control system 105 may control the galvanometers of the optical scanner 102 based on control signals received from the LIDAR control systems 110. For example, a digital-to-analog converter may convert coordinate routing information from the LIDAR control systems 110 to signals interpretable by the galvanometers in the optical scanner 102. In some examples, a motion control system 105 may also return information to the LIDAR control systems 110 about the position or operation of components of the optical scanner 102. For example, an analog-to-digital converter may in turn convert information about the galvanometers' position to a signal interpretable by the LIDAR control systems 110.

The LIDAR control systems 110 are further configured to analyze incoming digital signals. In this regard, the LIDAR system 100 includes optical receivers 104 to measure one or more beams received by optical circuits 101. For example, a reference beam receiver may measure the amplitude of a reference beam from the active optical component, and an analog-to-digital converter converts signals from the reference receiver to signals interpretable by the LIDAR control systems 110. Target receivers measure the optical signal that carries information about the range and velocity of a target in the form of a beat frequency, modulated optical signal. The reflected beam may be mixed with a second signal from a local oscillator. The optical receivers 104 may include a high-speed analog-to-digital converter to convert signals from the target receiver to signals interpretable by the LIDAR control systems 110. In some examples, the signals from the optical receivers 104 may be subject to signal conditioning by signal conditioning unit 107 prior to receipt by the LIDAR control systems 110. For example, the signals from the optical receivers 104 may be provided to an operational amplifier for amplification of the received signals and the amplified signals may be provided to the LIDAR control systems 110.

In some applications, the LIDAR system 100 may additionally include one or more imaging devices 108 configured to capture images of the environment, a global positioning system 109 configured to provide a geographic location of the system, or other sensor inputs. The LIDAR system 100 may also include an image processing system 114. The image processing system 114 can be configured to receive the images and geographic location, and send the images and location or information related thereto to the LIDAR control systems 110 or other systems connected to the LIDAR system 100.

In operation according to some examples, the LIDAR system 100 is configured to use nondegenerate optical sources to simultaneously measure range and velocity across two dimensions. This capability allows for real-time, long-range measurements of range, velocity, azimuth, and elevation of the surrounding environment.

In some examples, the scanning process begins with the optical drivers 103 and LIDAR control systems 110. The LIDAR control systems 110 instruct, e.g., via signal processor unit 112, the optical drivers 103 to independently modulate one or more optical beams, and these modulated signals propagate through the optical circuits 101 to the free space optics 115. The free space optics 115 directs the light at the optical scanner 102 that scans a target environment over a preprogrammed pattern defined by the motion control system 105. The optical circuits 101 may also include a polarization wave plate (PWP) to transform the polarization of the light as it leaves the optical circuits 101. In some examples, the polarization wave plate may be a quarter-wave plate or a half-wave plate. A portion of the polarized light may also be reflected back to the optical circuits 101. For example, lensing or collimating systems used in LIDAR system 100 may have natural reflective properties or a reflective coating to reflect a portion of the light back to the optical circuits 101.

Optical signals reflected back from an environment pass through the optical circuits 101 to the optical receivers 104. Because the polarization of the light has been transformed, it may be reflected by a polarization beam splitter along with the portion of polarized light that was reflected back to the optical circuits 101. In such scenarios, rather than returning to the same fiber or waveguide serving as an optical source, the reflected signals can be reflected to separate optical receivers 104. These signals interfere with one another and generate a combined signal. The combined signal can then be reflected to the optical receivers 104. Also, each beam signal that returns from the target environment may produce a time-shifted waveform. The temporal phase difference between the two waveforms generates a beat frequency measured on the optical receivers 104 (e.g., photodetectors).

The analog signals from the optical receivers 104 are converted to digital signals by the signal conditioning unit 107. These digital signals are then sent to the LIDAR control systems 110. A signal processing unit 112 may then receive the digital signals to further process and interpret them. In some embodiments, the signal processing unit 112 also receives position data from the motion control system 105 and galvanometers (not shown) as well as image data from the image processing system 114. The signal processing unit 112 can then generate 3D point cloud data that includes information about range and/or velocity points in the target environment as the optical scanner 102 scans additional points. The signal processing unit 112 can also overlay 3D point cloud data with image data to determine velocity and/or distance of objects in the surrounding area. The signal processing unit 112 also processes the satellite-based navigation location data to provide data related to a specific global location.

Figure 2:
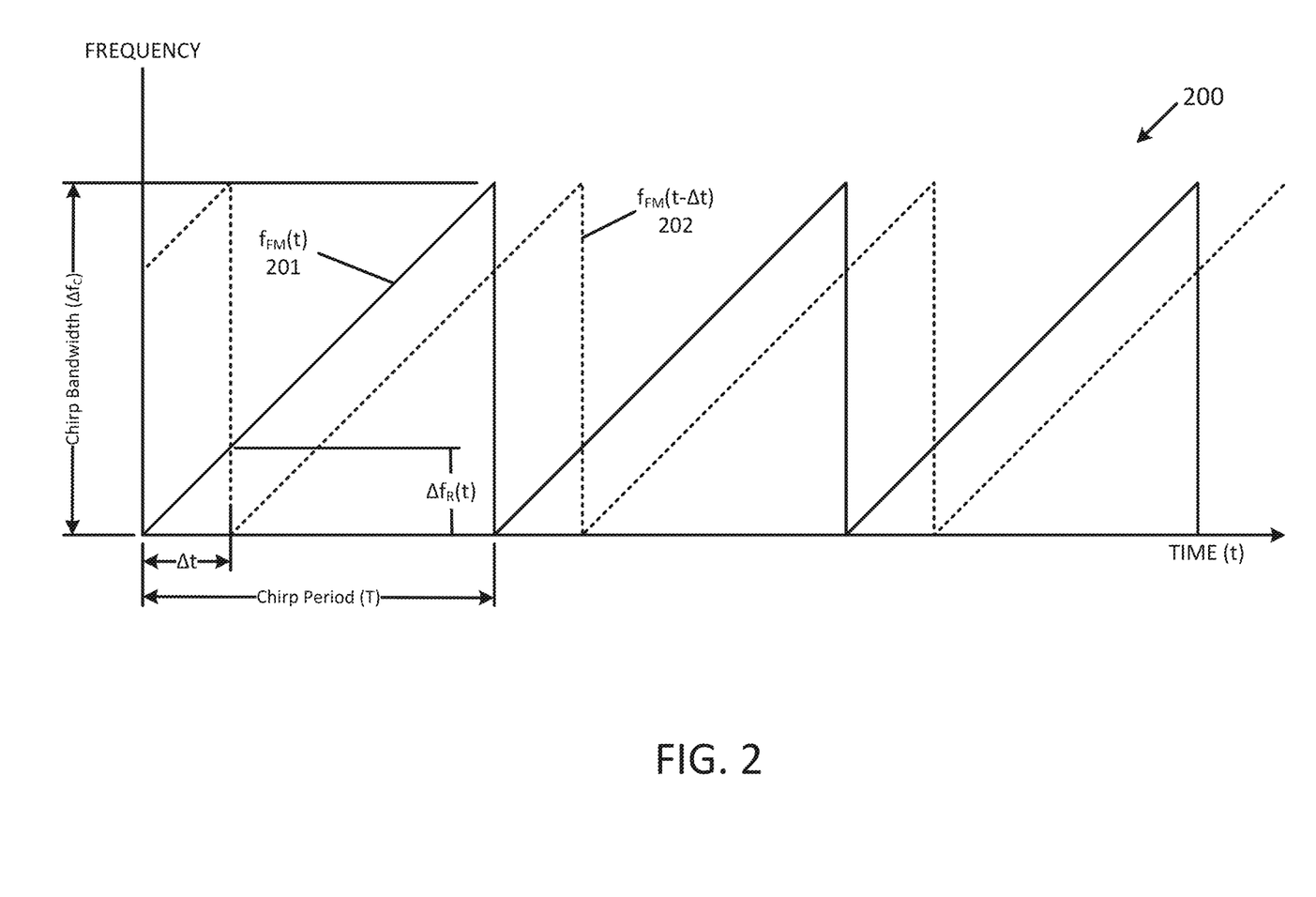
FIG. 2 is a time-frequency diagram illustrating one example of LIDAR waveforms produced by a LIDAR system utilizing dies produced from embodiments of the present disclosure.

FIG. 2 is a time-frequency diagram illustrating one example of LIDAR waveforms produced by a LIDAR system utilizing dies produced from embodiments of the present disclosure. FIG. 2 is a time-frequency diagram 200 of an FMCW scanning signal 201 that can be used by a LIDAR system, such as system 100, to scan a target environment according to some embodiments. In one example, the scanning waveform 201, labeled as $f_{FM}(t)$, is a sawtooth waveform (sawtooth "chirp") with a chirp bandwidth $\Delta f_C$ and a chirp period $T_C$. The slope of the sawtooth is given as $k=(\Delta f_C/T_C)$. FIG. 2 also depicts target return signal 202 according to some embodiments. Target return signal 202, labeled as $f_{FM}(t-\Delta t)$, is a time-delayed version of the scanning signal 201, where $\Delta t$ is the round trip time to and from a target illuminated by scanning signal 201. The round trip time is given as $\Delta t=2R/v$, where R is the target range and v is the velocity of the optical beam, which is the speed of light c. The target range, R, can therefore be calculated as $R=c(\Delta t/2)$. When the return signal 202 is optically mixed with the scanning signal, a range dependent difference frequency ("beat frequency") $\Delta f_R(t)$ is generated. The beat frequency $\Delta f_R(t)$ is linearly related to the time delay $\Delta t$ by the slope of the sawtooth k. That is, $\Delta f_R(t)=k\Delta t$. Since the target range R is proportional to $\Delta t$, the target range R can be calculated as $R=(c/2)(\Delta f_R(t)/k)$. That is, the range R is linearly related to the beat frequency $\Delta f_R(t)$. The beat frequency $\Delta f_R(t)$ can be generated, for example, as an analog signal in optical receivers 104 of system 100. The beat frequency can then be digitized by an analog-to-digital converter (ADC), for example, in a signal conditioning unit such as signal conditioning unit 107 in LIDAR system 100. The digitized beat frequency signal can then be digitally processed, for example, in a signal processing unit, such as signal processing unit 112 in system 100. It should be noted that the target return signal 202 will, in general, also includes a frequency offset (Doppler shift) if the target has a velocity relative to the LIDAR system 100. The Doppler shift can be determined separately, and used to correct the frequency of the return signal, so the Doppler shift is not shown in FIG. 2 for simplicity and ease of explanation. It should also be noted that the sampling frequency of the ADC will determine the highest beat frequency that can be processed by the system without aliasing. In general, the highest frequency that can be processed is one-half of the sampling frequency (i.e., the "Nyquist limit"). In one example, and without limitation, if the sampling frequency of the ADC is 1 gigahertz, then the highest beat frequency that can be processed without aliasing is ($\Delta f_{Rmax}$) 500 megahertz. This limit in turn determines the maximum range of the system as $R_{max}=(c/2)(\Delta f_{Rmax}/k)$ which can be adjusted by changing the chirp slope k. In one example, while the data samples from the ADC may be continuous, the subsequent digital processing described below may be partitioned into "time segments" that can be associated with some periodicity in the LIDAR system 100. In one example, and without limitation, a time segment might correspond to a predetermined number of chirp periods T, or a number of full rotations in azimuth by the optical scanner.

Figure 3:
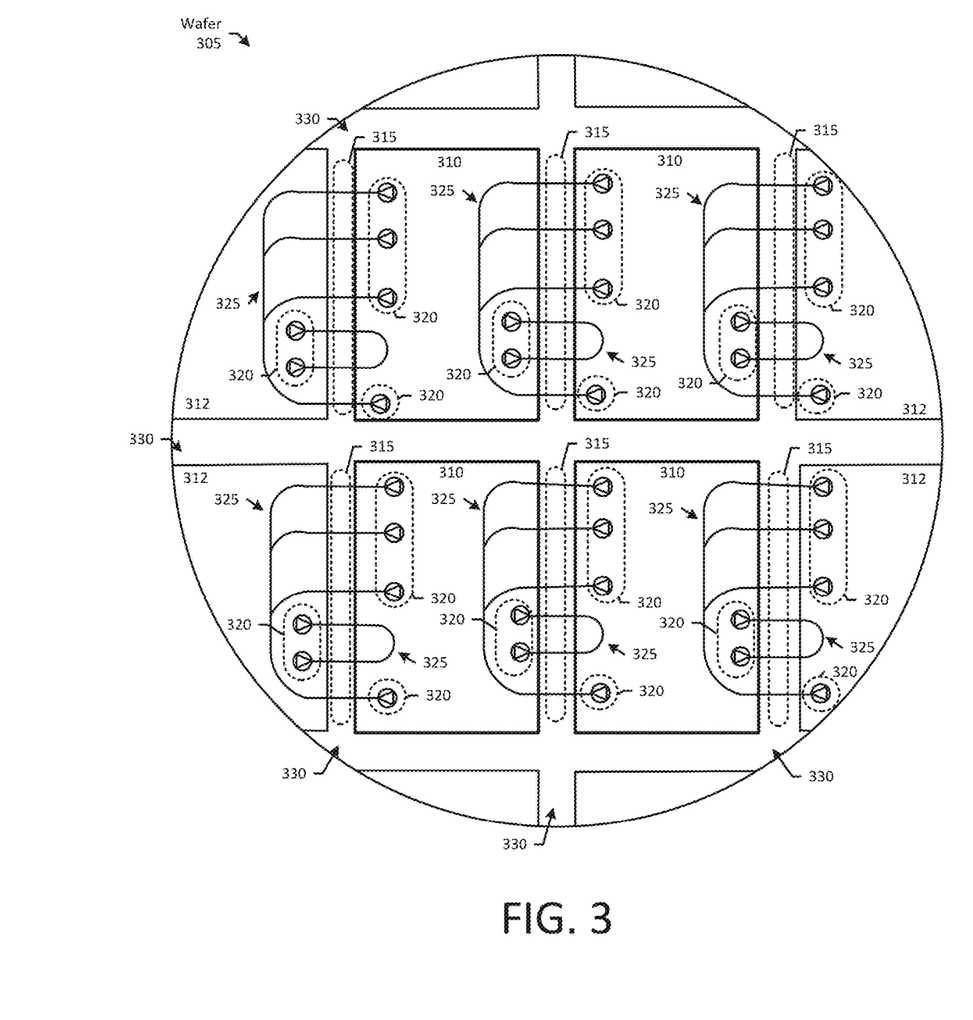
FIG. 3 is a block diagram illustrating an example wafer including dies and sacrificial structures for testing of the dies.

FIG. 3 depicts a top view of a wafer 305 including a set of completed dies 310 according to some embodiments. For simplicity of description, only four completed dies 310 are depicted on the wafer 305, which also includes four partially completed dies 312. It should be noted that the wafer 305 is not limited to the number of completed depicted in the figure and that wafers may include any number of completed dies 310. For example, the wafer 305 may include as many completed dies 310 that may fit on the wafer. As depicted in FIG. 3, the completed dies 310 each include integrated waveguides 325. Additionally, the completed dies 310 can include additional photonics components or electronic components, such as beam splitters, components to change polarization of an optical beam, optical detectors, or any other components depending on the design of the dies. It should be noted that embodiments described herein can be used for testing of any photonics die design that includes edge coupling.

As depicted, the completed dies 310 may be separated by a small space which may be the scribe lines 330 (e.g., the lines along which the dies are cut or etched to be separated). In some embodiments, sacrificial waveguides 315 may be placed in the scribe lines 330 between the completed dies 310. Additionally, grating couplers 320, which are bidirectional, are coupled to the sacrificial waveguides 315. For example, each of the sacrificial waveguides 315 may be optically coupled with a grating coupler 320 to receive, transmit, and emit an optical beam. Accordingly, prior to separating completed die 310 of the wafer 305, the integrated waveguides 325 may be capable of transmitting an optical beam to or from the sacrificial waveguides 315 and to or from the grating couplers 320. Thus, tests may be performed using the grating couplers 320 and the sacrificial waveguides 315 to provide an optical beam into and through the integrated waveguides 325 and to measure the throughput of the integrated waveguides 325 via the output from one or more of the grating couplers 320.

In some embodiments, the testing of the completed dies 310 may include generating and inputting an optical beam into one of the grating couplers 320 (e.g., input grating coupler) and measuring the output optical beam from one or more other grating couplers 320 (e.g., output grating couplers). In some embodiments, as described in more detail with respect to FIG. 5, optical detectors (e.g., photodiodes) may also be coupled to the sacrificial waveguides 315. Accordingly, the testing of the completed dies 310 may include generating and inputting an optical beam into a grating coupler 320 and measuring an electrical output generated by the optical detector (e.g., via electrical bond pads, see FIG. 5 and corresponding text for further details). In some embodiments, an optical source may be incorporated into completed die 310 and thus testing may include measuring the output beam from output grating couplers 320 of a neighboring die (e.g., sacrificial grating couplers) rather than inputting an optical beam to an input grating coupler. Thus, the testing may include both optical-to-optical testing as well as optical-to-electrical testing and electrical-to-optical testing.

In some embodiments, the grating couplers 320 may be provided within an unused portion of a neighboring die or in a waste area of the wafer 305, such as partial dies 312 disposed around the edges of the wafer 305. In some embodiments, the grating couplers 320 may also be disposed in the scribe line 330 with the sacrificial waveguides 315. Upon completion of the testing of the completed dies 310, the completed dies 310 may be separated into individual dies via a singulation process. Singulation may include, but is not limited to, etching, dicing, or a combination of etching and dicing of the wafer 305 along the scribe lines 330 to separate the completed dies 310 into individual dies that can be incorporated into photonics systems such as a LIDAR system. Thus, at least a portion of the sacrificial waveguides 315 (e.g., the portion that spans the scribe line 330) may be removed during the process of separating the dies. Additionally, any remaining portions of the sacrificial waveguides 315 and grating couplers 320 may be non-functioning after separation and may remain dormant in the unused space of the previously neighboring die, as described in further detail below with respect to FIG. 6.

By including the sacrificial waveguides and grating couplers for testing operation of the dies, sorting can be performed more efficiently and the number of working dies obtained from a wafer determined prior to die singulation. The use of the sacrificial structures reduce the cost of manufacture and testing while also simplifying the testing process. For example, optical testing of the die may include inserting an optical beam into the die from the front surface via a sacrificial grating coupler 320 and also measuring the output from an output grating coupler at the surface. Thus, no probes are inserted into gaps which could damage the dies and rather an optical beam is provided and measured at or above a surface of the die.

Figure 4A:
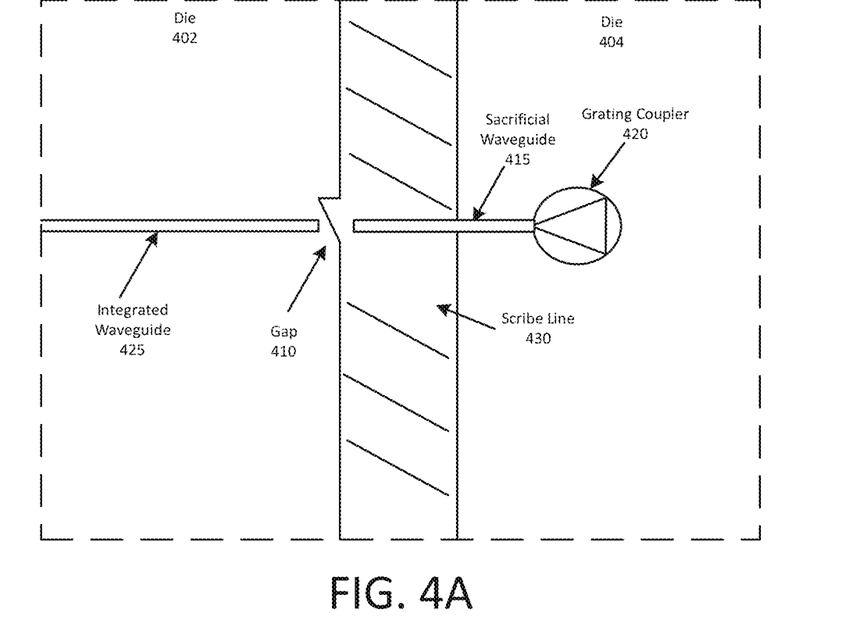
FIG. 4A is a block diagram illustrating an example sacrificial waveguide and grating coupler structure.

FIG. 4A depicts a close view of an example sacrificial waveguide configuration according to some embodiments. As depicted, in some embodiments the sacrificial waveguide 415 spans the scribe line 430 between die 402 and die 404 (an adjacent or neighboring die) with a small gap 410 between the sacrificial waveguide 415 and the integrated waveguide 425 of die 402 prior to separation of the dies of the wafer. For example, in some embodiments, the gap 410 between the sacrificial waveguide 415 and the integrated waveguide 425 may be less than two micrometers thereby making any power loss from the optical beam insignificant. As such, prior to separating the dies during singulation, one or more tests may be performed to confirm that the components (e.g., waveguides and other optical components) of the die operate as intended (e.g., according to design).

For example, the one or more tests may include inputting an optical beam into die 402 via a grating coupler (e.g., grating coupler 420 or other grating coupler) and measuring the output of the optical beam at a separate grating coupler (e.g., grating coupler 420 or other grating coupler). The sacrificial waveguide 415 and grating coupler 420 may be an input for an optical beam or an output for an optical beam as described with respect to FIG. 3. Although a facet angle is depicted at an output of the integrated waveguide 425, other optical components or structures may be used for optical control of the output of the integrated waveguide 425 (e.g., edge coupling or other optical components).

The gap 410 provided between the integrated waveguide 425 and the sacrificial waveguide 415 may allow the sacrificial waveguide 415 to be removed during singulation such that the structure and operation of the integrated waveguide 425 are not affected. Thus, singulation may be performed without any modification to the etching or dicing process being used for the singulation. In some embodiments, a portion of the sacrificial waveguide 415 and the grating coupler 420 may remain in the waveguide after singulation and be unused. Additionally, although depicted as fully spanning the scribe line 430, in some embodiments the sacrificial waveguide 415 and the grating coupler 420 may both be disposed within the scribe line 430. Thus, in some embodiments the entire sacrificial waveguide 415 and grating coupler 420 may be completely removed during singulation.

Figure 4B:
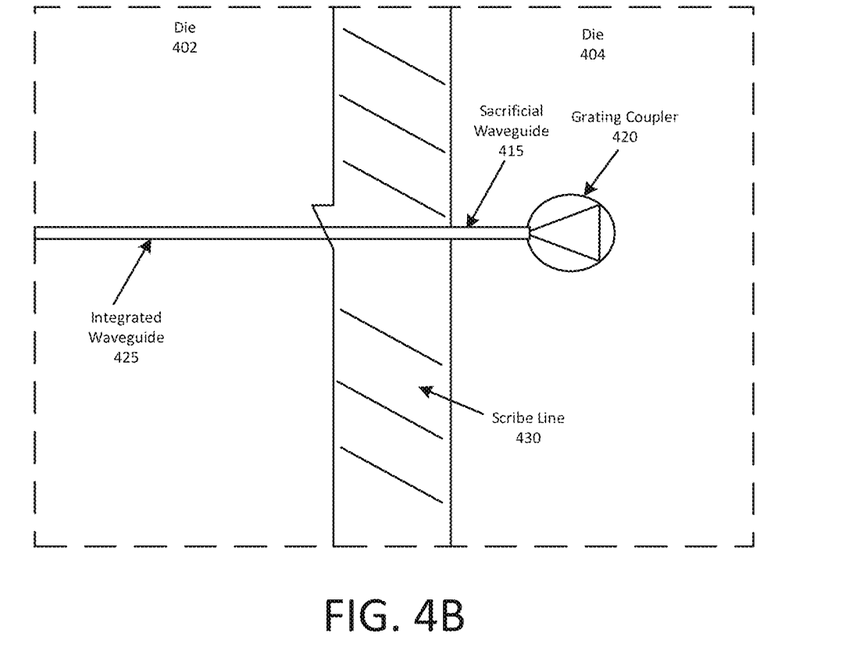
FIG. 4B is a block diagram illustrating another example sacrificial waveguide and grating coupler structure.

FIG. 4B depicts another view of another sacrificial waveguide configuration according to some embodiments. The configuration depicted in FIG. 4B includes a sacrificial waveguide 415 optically coupled with the integrated waveguide 425 without a gap in between. The configuration of the sacrificial waveguide 415 according to FIG. 4B may be the same or similar to the configuration of FIG. 4A including die 402 and die 404. The continuous waveguide may provide for simpler manufacturing than the gap between the integrated waveguide 425 and the sacrificial waveguide 415 of FIG. 4A.

Figure 5:
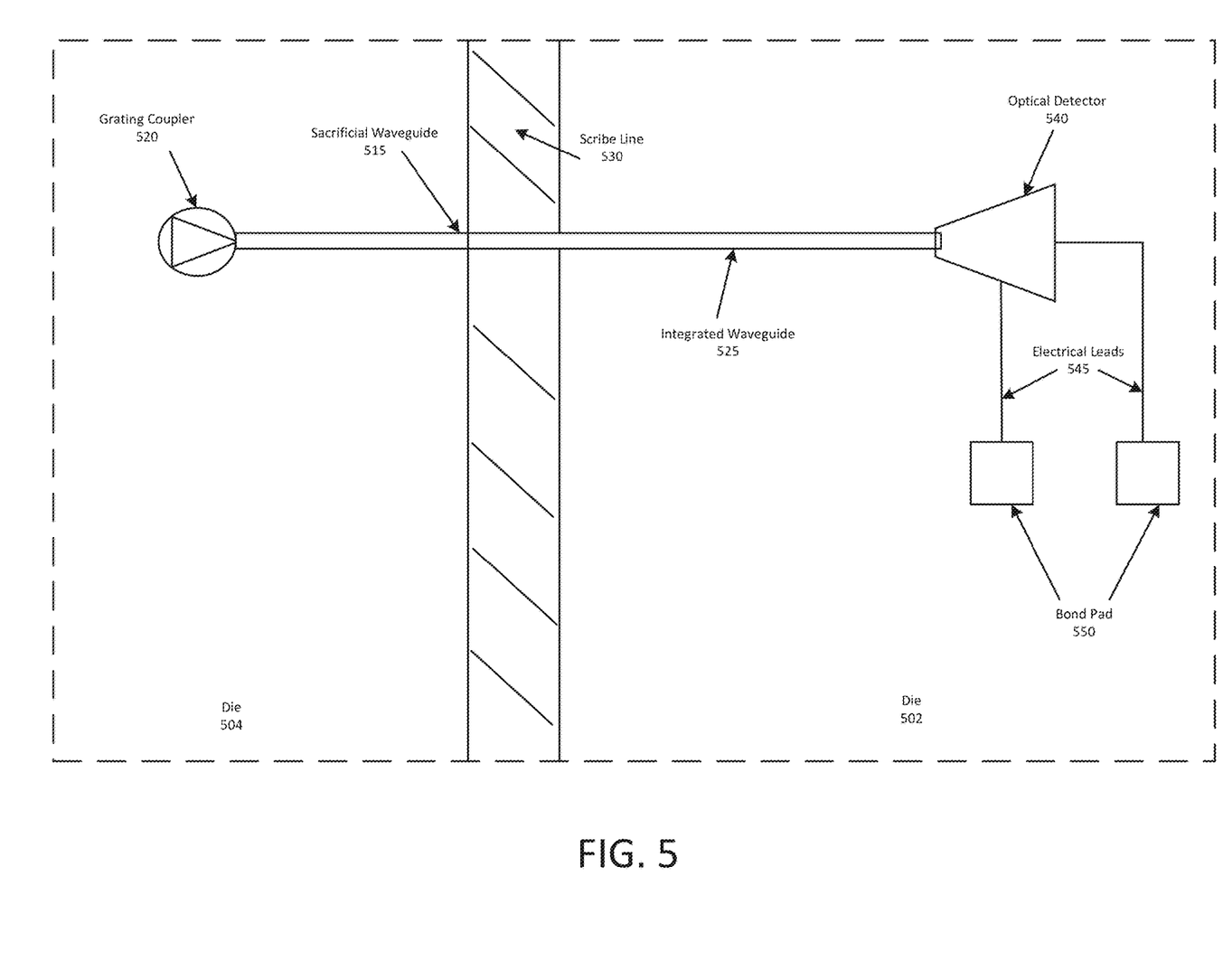
FIG. 5 is a block diagram illustrating an example sacrificial waveguide and photodiode for optical to electrical testing of a photonics die.

FIG. 5 depicts another close view of another example sacrificial waveguide configuration for optical-to-electrical testing of a die according to some embodiments. Die 502 may include an optical detector 540 (e.g., a photodiode) and an integrated waveguide 525 designed to receive and direct an optical beam to the optical detector 540. In some embodiments, a sacrificial waveguide 515 and grating coupler 520 may be included in the scribe line 530 between die 502 and die 504. The grating coupler 520 can be used to input an optical beam into the sacrificial waveguide 515 which transmits the optical beam to the integrated waveguide 525 of die 502 which directs the beam to the optical detector 540. The optical detector 540 generates an electrical signal upon receiving the optical beam. The amplitude of the current or electrical signal generated by the optical detector can be directly proportional to the intensity of the optical beam. Electrical leads 545 may be electrically coupled with the optical detector 540 and to bond pads 550. The bond pads 550 may be exposed on a surface of die 502 for coupling of electrical devices. The bond pads 550 may also be used during testing to measure the electrical current received from the optical detector 540 (e.g., by touching electrical probes to the bond pads 550 to complete a circuit). Based on the intensity of the optical beam input at the grating coupler 520, a minimum expected current or signal should be produced by the optical detector if the optical detector 540 and integrated waveguides 525 are operating as intended. Accordingly, the current produced by the optical detectors 540 and measured via the bond pads 550 can be used to test whether the components and structure of the die operate as expected according to the die design.

It should be noted that the design and configuration of the waveguides, the optical detector, electrical leads, and bond pads are simplified for ease of description. Any number of optical detectors, waveguides, leads, and bond pads can be used according to embodiments of the present disclosure. Furthermore, any design or structure of the waveguides and combination of the optical components can be used. Additionally, the configuration of FIG. 5 may be used in conjunction with the configurations of FIGS. 4A and 4B to provide optical-to-optical testing as well as optical-to-electrical testing of components and waveguide structures of a die at the wafer level (e.g., prior to singulation).

Figure 6:
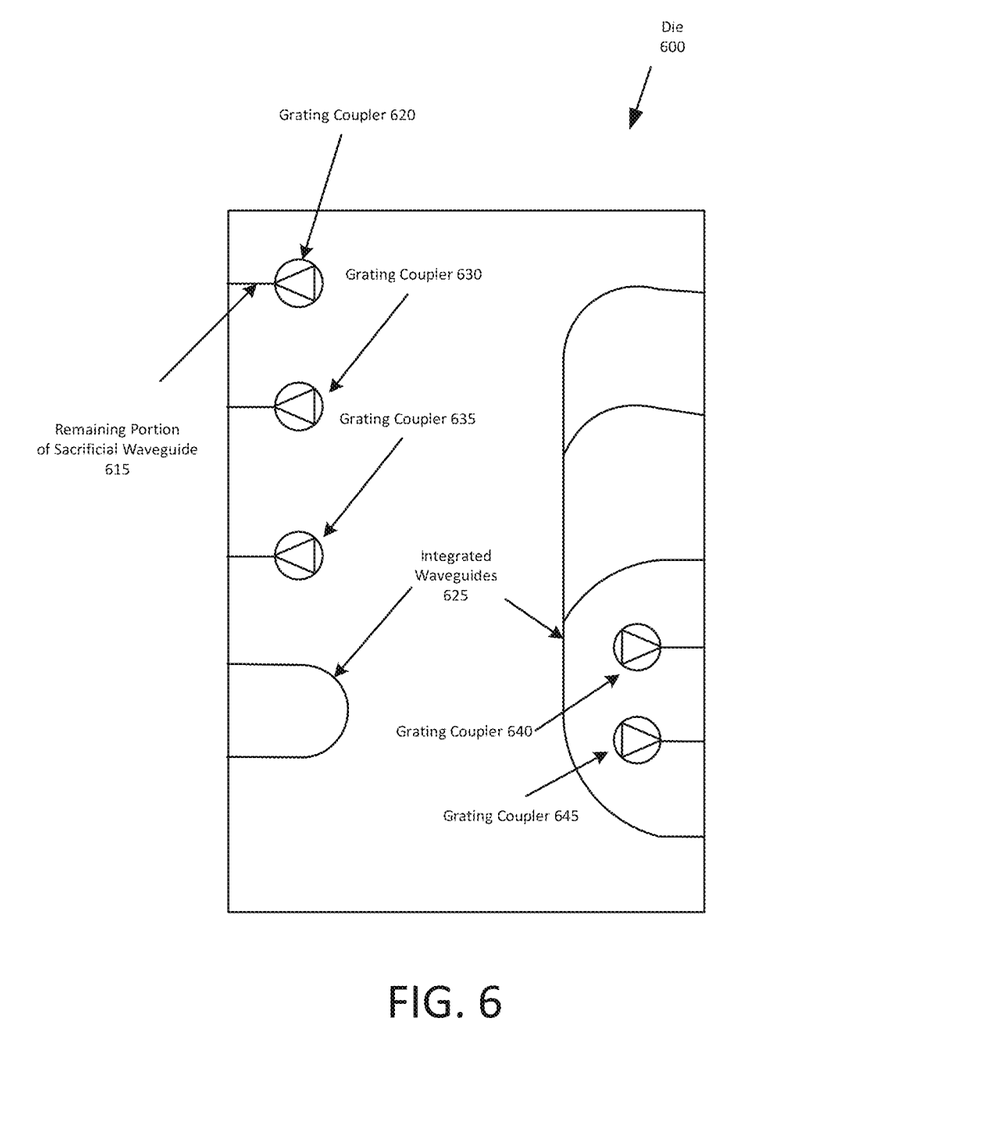
FIG. 6 is an illustration of a photonics die after separation and removal of the sacrificial waveguides.

FIG. 6 depicts a die 600 after separation and removal of the sacrificial waveguides, according to some embodiments. As can be seen in FIG. 6, the portion of the sacrificial waveguides that spanned the scribe lines of the wafer have been removed, leaving the remaining portion of the sacrificial waveguides 615 initially coupled to neighboring dies. The remaining portions of the sacrificial waveguides 615 do not affect the operation of die 600. The integrated waveguides 625 and grating couplers 620, 630, 635, 640, and 645 remain in die 600 as designed after singulation. The separated die 600 may be sorted based on the results of the one or more wafer level optical tests discussed above with respect to FIG. 3.

Figure 7:
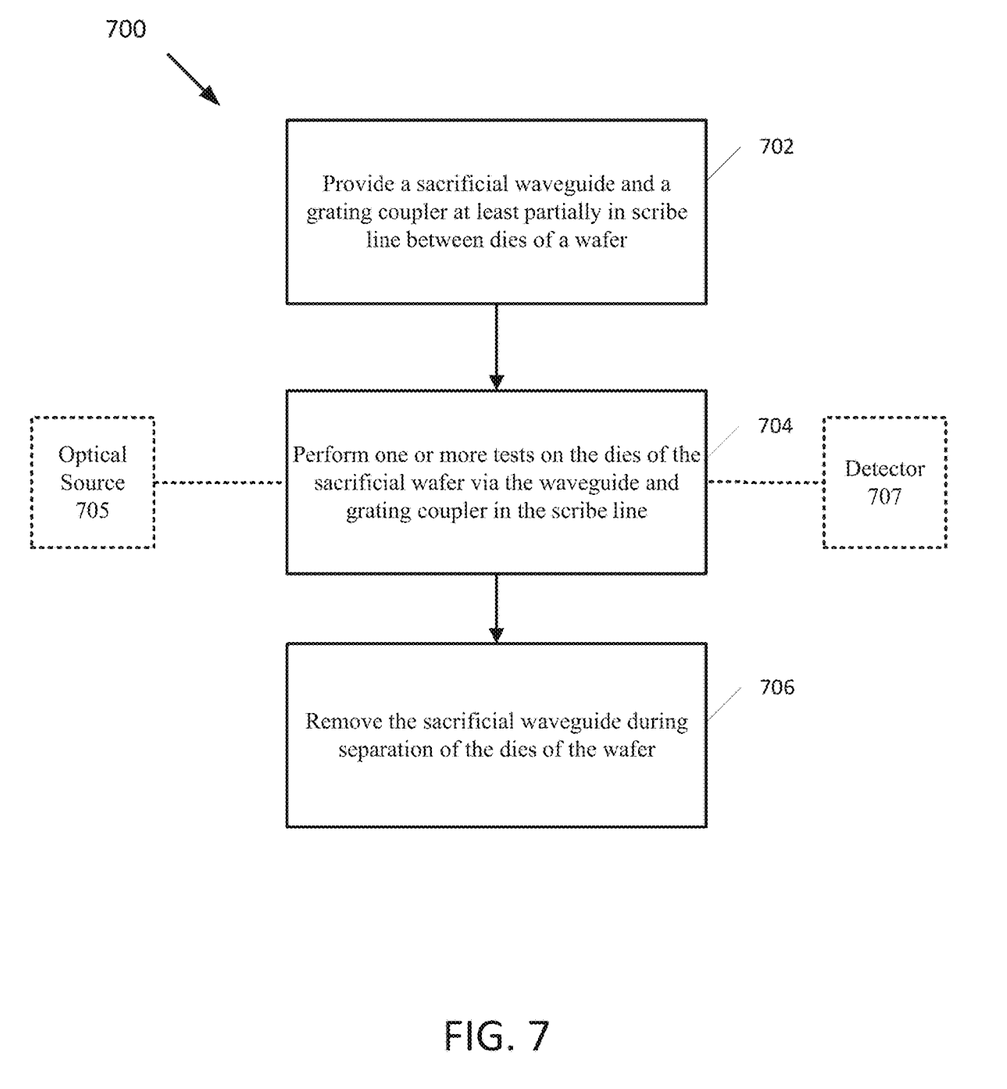
FIG. 7 is a flow diagram of a method of testing a photonics die using a sacrificial waveguide and grating coupler, according to some embodiments.

FIG. 7 is a flowchart illustrating a method 700 of performing die testing at the wafer level using a sacrificial waveguide, according to some embodiments.

Method 700 begins at block 702, where a sacrificial waveguide and a grating coupler are provided at least partially in a scribe line between dies of a wafer. The dies of the wafer may be dies (e.g., for a LIDAR system). The sacrificial waveguide is aligned with a waveguide of the die to transmit an optical beam from the waveguides of the die to the grating coupler. The grating coupler may be disposed in an unused, neutral area of a neighboring die or within the scribe line between the dies.

At block 704, one or more tests are performed on the dies of the wafer via the sacrificial waveguide and grating coupler in the scribe line. The one or more tests may include inputting an optical beam (e.g., using optical source 705) into an input grating coupler and measuring the output of the optical beam (e.g., using detector 707) after the optical beam has been transmitted through the waveguides of the die. In some examples, the input grating coupler may be disposed in the neighboring die and a sacrificial waveguide transmits the input optical beam to an input waveguide of the die. The optical beam may then propagate through the waveguides of the die to the outputs of the waveguides at which point the optical beam is propagated through sacrificial waveguides corresponding to each output. The sacrificial waveguides carry the optical beam to the grating couplers to be output and measured. For example, an optical detector (e.g., detector 707) may measure the intensity of the outputs from each of the output grating couplers. In some embodiments, processing logic may compare the measures intensity of the outputs with expected output intensity based on the power of the input optical beam and the design of the photonics chip.

At block 706, the sacrificial waveguide is removed during separation of the dies of the wafer. Separation of the dies of the wafer may include etching away the scribe line, dicing the wafer along the scribe lines, or a combination of etching and dicing of the scribe lines. If the grating coupler is disposed in the scribe line, the entire sacrificial waveguide and the grating coupler are removed during separation. If the grating coupler is disposed in a neighboring die then the portion of the sacrificial waveguide in the scribe line is removed during separation while the grating coupler and any portion of the sacrificial waveguide that extends beyond the scribe line remains in the neighboring waveguide. Thus, the sacrificial waveguides and the associated grating couplers may be used to perform wafer level testing of dies prior to singulation, after which they can be removed without changes to the method of singulation being used.

The preceding description sets forth numerous specific details such as examples of specific systems, components, methods, and so forth, in order to provide a thorough understanding of several examples in the present disclosure. It will be apparent to one skilled in the art, however, that at least some examples of the present disclosure may be practiced without these specific details. In other instances, well-known components or methods are not described in detail or are presented in simple block diagram form in order to avoid unnecessarily obscuring the present disclosure. Thus, the specific details set forth are merely exemplary. Particular examples may vary from these exemplary details and still be contemplated to be within the scope of the present disclosure.

Any reference throughout this specification to "one example" or "an example" means that a particular feature, structure, or characteristic described in connection with the examples are included in at least one example. Therefore, the appearances of the phrase "in one example" or "in an example" in various places throughout this specification are not necessarily all referring to the same example.

Although the operations of the methods herein are shown and described in a particular order, the order of the operations of each method may be altered so that certain operations may be performed in an inverse order or so that certain operation may be performed, at least in part, concurrently with other operations. Instructions or sub-operations of distinct operations may be performed in an intermittent or alternating manner.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Furthermore, the terms "first," "second," "third," "fourth," etc. as used herein are meant as labels to distinguish among different elements and may not necessarily have an ordinal meaning according to their numerical designation.

What is claimed is:

1. A method of photonics die testing, comprising:
   providing a first grating coupler and a second grating coupler on a first die, a first integrated waveguide on a second die, and a first sacrificial waveguide at least partially in a scribe line between the first die and the second die of a wafer, wherein the first integrated waveguide couples directly to the first sacrificial waveguide;
   providing a third grating coupler and a fourth grating coupler on the second die, a second integrated waveguide on the first die, and a second sacrificial waveguide at least partially in the scribe line, wherein the second integrated waveguide couples directly to the second sacrificial waveguide;
   performing one or more first tests on the first die and the second die of the wafer via the first grating coupler, the first sacrificial waveguide, the first integrated waveguide, and the second grating coupler;
   performing one or more second tests on the second die and the first die of the wafer via the third grating coupler, the second sacrificial waveguide, the second integrated waveguide, and the fourth grating coupler; and
   removing the first sacrificial waveguide and the second sacrificial waveguide during separation of the first die and the second die of the wafer.

2. The method of claim 1, wherein the separation of the first die and the second die comprises at least one of etching, dicing, or etching and dicing.

3. The method of claim 1, further comprising:
   performing the one or more first tests on the first die and the second die of the wafer prior to removing the first sacrificial waveguide.

4. The method of claim 1, wherein the second die is incorporated into a frequency modulated continuous wave (FMCW) light detection and ranging (LIDAR) system.

5. The method of claim 1, wherein the one or more first tests comprise a measurement of light transmitted through the first grating coupler, the first sacrificial waveguide, the first integrated waveguide, and the second grating coupler.

6. The method of claim 1, wherein the first sacrificial waveguide is in the scribe line between the first die and the second die.

7. The method of claim 6, wherein the first grating coupler is provided in a neutral area of the first die.

8. The method of claim 7, wherein the first sacrificial waveguide is removed during separation of the first die and the second die, and wherein the first grating coupler remains within the first die.

9. A system, comprising:
   a wafer comprising:
      a plurality of dies comprising a first die and a second die; and
      a plurality of sacrificial waveguides and a plurality of grating couplers associated with integrated waveguides of the plurality of dies, wherein the first die comprises a first grating coupler and a second grating coupler from the plurality of grating couplers, wherein the second die comprises a first integrated waveguide from the integrated waveguides, and wherein a first sacrificial waveguide, from the plurality of sacrificial waveguides, couples directly to the first integrated waveguide and is disposed at least partially in a scribe line between the first die and the second die, and wherein the second die further comprises a third grating coupler and a fourth grating coupler, from the plurality of grating couplers, wherein the first die further comprises a second integrated waveguide from the integrated waveguides, and wherein a second sacrificial waveguide, from the plurality of sacrificial waveguides, couples directly to the second integrated waveguide and is disposed at least partially in the scribe line; ; and a detector to test a first optical transmission of at least one die of the plurality of dies via the first grating coupler, the first sacrificial waveguide, the first integrated waveguide, and the second grating coupler, and to test a second optical transmission of at least one die of the plurality of dies via the third grating coupler, the second sacrificial waveguide, the second integrated waveguide, and the fourth grating coupler.

10. The system of claim 9, wherein each sacrificial waveguide of the plurality of sacrificial waveguides is disposed in the scribe line between dies of the wafer and wherein each grating coupler of the plurality of grating couplers is provided in a neutral area of a neighboring die.

11. The system of claim 9, wherein a gap is provided between the first sacrificial waveguide and the first integrated waveguide.

12. The system of claim 9, wherein the plurality of dies of the wafer are tested prior to removing the plurality of sacrificial waveguides during separation of the plurality of dies.

13. The system of claim 9, wherein at least one of the plurality of grating couplers is provided in a waste area of the wafer.

14. The system of claim 9, wherein the plurality of dies of the wafer comprises a plurality of photonics chip dies.

15. The system of claim 14, further comprising:
an optical source to transmit an optical beam through waveguides of the plurality of photonics chip dies, through the sacrificial waveguides, and out the grating couplers for testing of the plurality of photonics chip dies via the detector.

* * * * *